US006689655B2

United States Patent
Coronel et al.

(10) Patent No.: US 6,689,655 B2
(45) Date of Patent: Feb. 10, 2004

(54) METHOD FOR PRODUCTION PROCESS FOR THE LOCAL INTERCONNECTION LEVEL USING A DIELECTRIC CONDUCTING PAIR ON PAIR

(75) Inventors: Philippe Coronel, Barraux (FR); Francois Leverd, Saint Ismier (FR); Paul Ferreira, Goucelin (FR)

(73) Assignee: STMicroelectronics S.A., Montrouge (FR)

( * ) Notice: Subject to any disclaimer, the term of this patent is extended or adjusted under 35 U.S.C. 154(b) by 102 days.

(21) Appl. No.: 10/081,296

(22) Filed: Feb. 20, 2002

(65) Prior Publication Data

US 2002/0142519 A1 Oct. 3, 2002

(30) Foreign Application Priority Data

Feb. 21, 2001 (FR) ............................................. 01 02347

(51) Int. Cl.[7] ......................................... H01L 21/8234
(52) U.S. Cl. ...................... 438/238; 438/586; 438/233; 438/303
(58) Field of Search ................................ 257/377, 382, 257/383; 438/297, 453, 499, 238, 586, 225, 233, 303, 152, 301

(56) References Cited

U.S. PATENT DOCUMENTS 5,913,136 A * 6/1999 Deleonibus .................. 438/586

FOREIGN PATENT DOCUMENTS

| JP | 1994277506 | * 11/1994 | ........... H01L/21/28 |
| JP | 2001168059 | * 12/1999 | ....... H01L/21/3205 |

* cited by examiner

Primary Examiner—Carl Whitehead, Jr.
Assistant Examiner—Yennhu B Huynh
(74) Attorney, Agent, or Firm—Lisa K. Jorgenson; Jon A. Gibbons; Fleit, Kain, Gibbons, Gutman, Bongini & Bianco P.L.

(57) ABSTRACT

The invention relates to a process for protection of the grid of a transistor in an integrated circuit for production of a local interconnection pad straddling over the grid and the silicon substrate on which it is formed. The process consists of applying a double dielectric-conducting layer on the transistor grid into which a polysilicon layer is added in order to use the selectivity principle, which is large considering the etching of polysilicon with respect to the oxide in which the local interconnection pad is formed. Furthermore, with the process according to the invention, a silicidation treatment can be applied beforehand on the active areas of the transistor and the grid.

8 Claims, 7 Drawing Sheets

METHOD FOR PRODUCTION PROCESS FOR THE LOCAL INTERCONNECTION LEVEL USING A DIELECTRIC CONDUCTING PAIR ON PAIR

CROSS REFERENCE TO RELATED APPLICATIONS

This application is based upon and claims priority from prior French Patent Application No. 01 02347, filed Feb. 21, 2001, the disclosure of which is hereby incorporated by reference in its entirety.

BACKGROUND OF THE INVENTION

1. Field of the Invention

The present invention generally relates to a process for the use of a local interconnection architecture of a memory cell and more particularly to improve the density at the scale of an elementary cell of an integrated circuit, for example a DRAM or SRAM type memory cell.

2. Description of Related Art

In this type of cell, the local interconnection level (LIL) is made before the first metal deposit.

FIG. 1 illustrates the context of the invention. The local interconnection level 1 is composed of a pad preferably made from tungsten, the function of which is to connect the access transistor 2 of the cell that is formed on the substrate made of silicon Si at the top contact 3.

In order to make the tungsten interconnection level, a series of special steps is applied immediately after formation of the polysilicon grid 2g and the nitride type spacers 2e and 2e' located on each side of the transistor grid 2g. These steps consist of making an oxide OX deposit and making the etching that defines the recess of the interconnection pad in the oxide layer using a mask. Conventionally, the step in which the layer oxide OX is deposited is preceded by a step in which a nitride film is deposited to protect the isolation trenches 4 if the oxide layer is etched to make the local interconnection level straddle over isolation trenches.

The Shallow Trench Isolations (STI) that are intended to isolate cells from each other to avoid the parasitic electrical effects of a transistor on its neighbor are filled with oxide.

Thus, etching at the local interconnection level is done in two steps. First, the oxide layer is etched, the nitride film then acts as a stop layer due to the known selectivity between the oxide and nitride materials, and second the nitride film is then etched in turn.

In the particular interconnection architectures shown in FIG. 2, the LIL 1 is straddled over the grid 2g of transistor 2 in order to save density and therefore reduce the size of each cell.

This technique although useful, is not without its problems. One problem that then arises is to isolate the polysilicon forming the tungsten transistor grid forming the interconnection pad, in order to avoid short circuits.

Several architectures of this type are already known in prior art. However, none is fully satisfactory.

One solution according to prior art to make the local interconnection level straddle over the transistor grid while avoiding electrical contact between the polysilicon of the grid and the tungsten of the interconnection pad consists of making the transistor grid using a hard dielectric mask for example from nitride, that will remain on the polysilicon of the grid.

This is why, as shown in FIG. 3, the polysilicon in grid 2g of the transistor will be covered by a double layer composed of the hard nitride mask 5 and the nitride film 6 that is deposited before the specific steps prior to production of the LIL to protect the isolation trenches 4.

Thus, due to this double protection, a residual nitride thickness will remain above the polysilicon forming the transistor grid after etching the local interconnection pad produced in two phases a and b through the mask M.

The two phases a and b are applied to etch the oxide layer OX and the nitride film 6 as described above, respectively.

The interconnection pad can then straddle over the transistor grid 2g without the need for any electrical contact between the polysilicon of the grid and the tungsten forming the interconnection pad. The dielectric covering the grid then isolates the polysilicon and prevents any electrical link with the local interconnection level.

However, this solution according to prior art has a major disadvantage. One disadvantage, using this prior art process for producing the transistor grid, is that it cannot be used to form a silicide on the transistor grid.

This type of treatment of the transistor grid and its other active parts that consists of depositing a cobalt layer and increasing the temperature in order to initiate a selective reaction forming a deposit of cobalt silicon $CoSi_2$ at the recesses of the silicon and polysilicon, has become unavoidable. This silicidation treatment reduces the input resistance of the transistor by several orders of magnitude.

The transistor grid in the solution according to prior art was made with a hard nitride dielectric mask that remains on the polysilicon, consequently the silicidation reaction between the cobalt and the polysilicon can no longer be carried out.

Therefore, with this solution it is impossible to increase the density while straddling the local interconnection level over the transistor grid, and also benefit from the grid silicidation treatment.

A choice has to be made which limits the attractiveness of this solution.

Another solution according to prior art to prevent any electrical contact between the polysilicon and the tungsten when the local interconnection level LIL straddles over the transistor grid is presented with reference to FIGS. 4A and 4B.

The construction with reference to FIG. 4A requires an oxide layer OX to be deposited on transistor 2, and then a second mask M should be added that is complementary to the grid lines, in other words the mask that was used for formation of the grid 2g of transistor 2.

Thus, mask M can open the oxide layer OX only above the grid 2g of transistor 2 by using a particular chemical attack.

As shown in FIG. 4b, a dielectric layer 5 acting as protection and insulation for the grid 2g of transistor 2, for example a nitride layer, is then added into the opening previously created in the oxide layer and covering the entire polysilicon of the grid.

However, the disadvantage of this construction according to prior art is that it is essential that the opening of mask M is positioned precisely above the grid.

Therefore, the alignment of the mask over the grid must be perfect. The consequence of the slightest offset in the recess of the mask will be that the polysilicon in the grid will not be fully covered by the dielectric protection.

However in existing technologies, grid sizes tend towards orders of magnitude of the order of 100 nanometers, while alignment tolerances for making cells are not better than the order of 45 nanometers.

Thus, due to these tolerance problems in producing the photo for a mask, this solution is unsuitable for technologies that use increasingly small components.

Accordingly, a need exists to over come these disadvantages of the prior art and to provide a process to a protection to the polysilicon forming the grid of a transistor and to electrically isolate the local interconnection pad in architectures in which the interconnection pad straddles over the transistor grid.

Moreover, a need exists to over come these disadvantages of the prior art and to provide a process to ensure that the protection used for the polysilicon in the grid so it remains compatible with the silicidation treatment of active areas of the transistor and the grid made in advance.

SUMMARY OF THE INVENTION

The present invention uses a dielectric-conducting pair on the grid, and therefore to make a double layer in which a polysilicon layer is introduced to use the selectivity principle, which is large considering etching of the polysilicon with respect to the oxide in which the LIL interconnection pad is formed.

Therefore, the invention relates to a process for the protection of the grid of a transistor in an integrated circuit to make an local interconnection pad straddling over the grid and the silicon substrate on which it is formed, characterized in that it comprises:

deposit a nitride layer and then a polysilicon layer on the silicon substrate and on the grid to form a double dielectric-conducting layer;

deposit an oxide layer to cover the double dielectric-conducting layer;

remove the oxide layer under the grid level to expose the top part of the double layer above the grid;

use a mask for an etching step to remove the polysilicon layer in an area located above the grid between two consecutive transistors in order to avoid short circuits;

implant low energy doping agents in the polysilicon layer to implant only polysilicon exposed by the oxide layer;

remove the entire remaining oxide layer;

selectively etch to remove only the part of the polysilicon layer which has not been doped;

deposit an oxide layer;

make a photo-engraving of the oxide layer in order to define a recess that straddles over the grid and the silicon substrate in which the interconnection pad will be formed.

BRIEF DESCRIPTION OF THE DRAWINGS

The subject matter which is regarded as the invention is particularly pointed out and distinctly claimed in the claims at the conclusion of the specification. The foregoing and other features, and advantages of the invention will be apparent from the following detailed description taken in conjunction with the accompanying drawings.

DETAILED DESCRIPTION OF AN EMBODIMENT

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements maybe in the plural and vice versa with no loss of generality.

Figure 1:
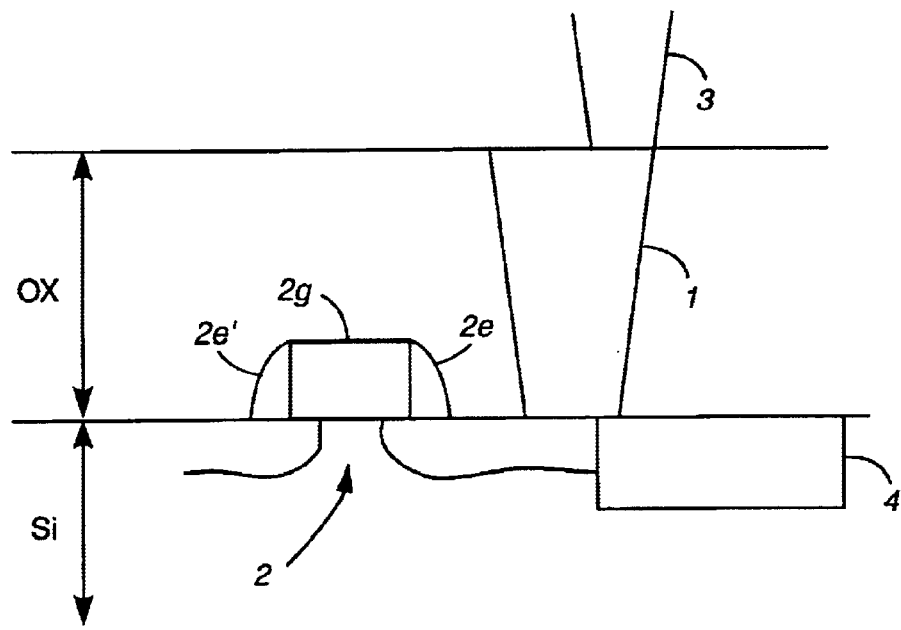
FIGS. 1 and 2 are diagrams illustrating the context of the invention, and have already been described.
Figure 2:
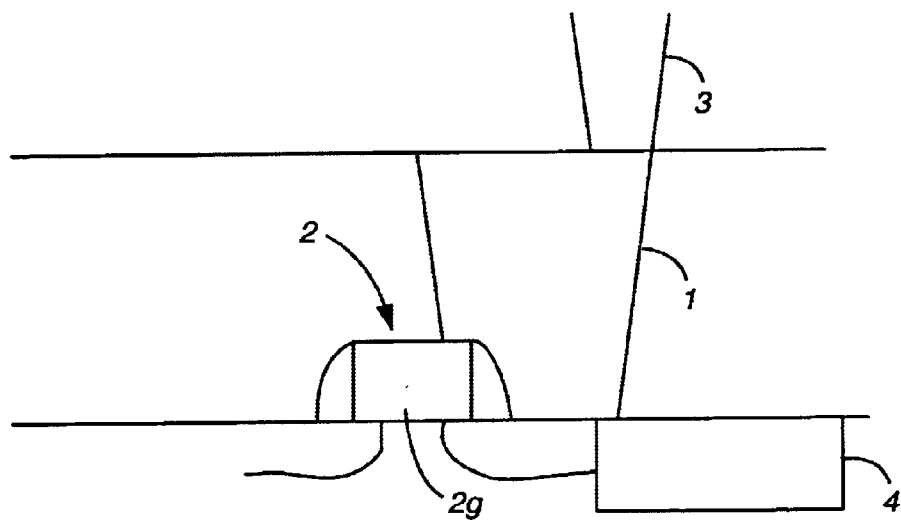
Figure 3:
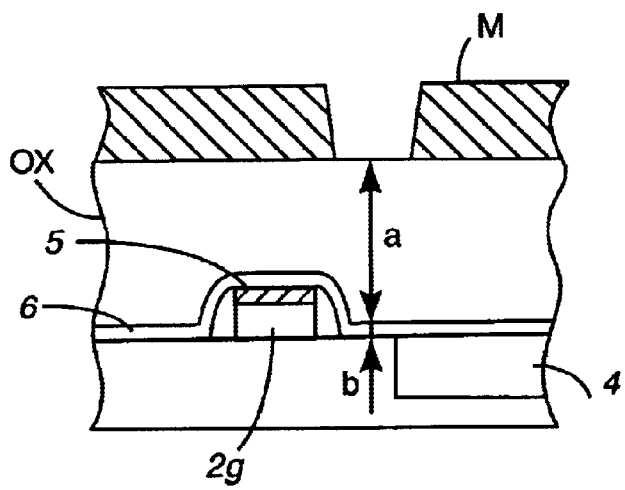
FIG. 3 is a diagram illustrating a first solution according to prior art, and has already been described.
Figure 4A:
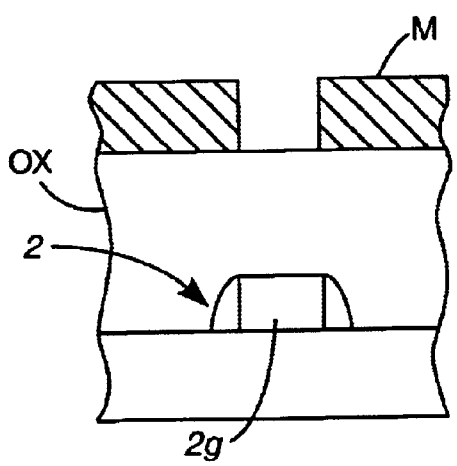
FIGS. 4A and 4B are diagrams illustrating a second solution according to prior art, and have already been described.
Figure 4B:
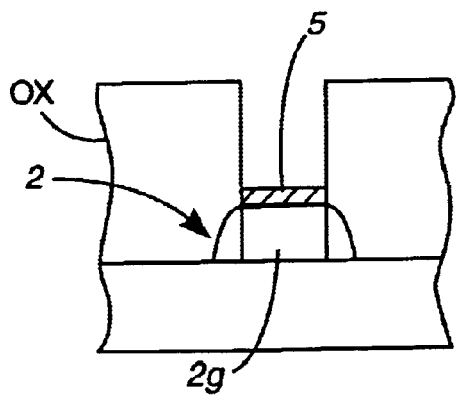
Figure 5:
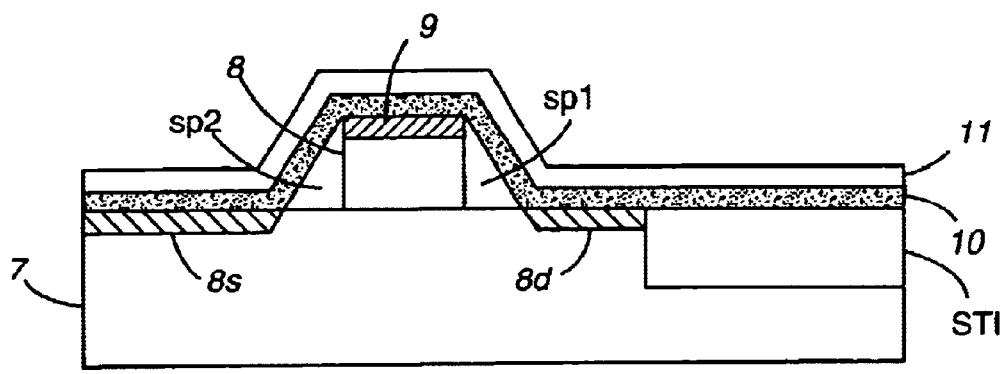
FIGS. 5 to 17 are diagrams illustrating the different steps in the process according to the invention.

Turning now to FIG. 5, shown is the first step in the process according to the invention. FIG. 5 shows a silicon substrate 7 in which an isolation trench STI filled with oxide is made.

Grid 8 of a transistor is formed on a silicon substrate 7. Nitride type spacers sp1 and sp2 are placed on each side of the grid 8. The grid is made of polysilicon and has previously been subjected to a silicidation treatment in order to reduce its input resistance.

Thus, a cobalt layer has been deposited and after heating to increase the temperature to enable a reaction between the cobalt and the polysilicon in the grid, a silicidation layer 9 made of cobalt silicon $CoSi_2$ is formed above the grid 8 of the transistor and covers it.

The other active areas 8s and 8d of the transistor have also been subjected to the same silicidation treatment. (Active areas 8s and 8d are not shown in the following FIGs.).

However, note that the process described above can also be used in the case in which the active areas of the transistor have not been subjected to a silicidation treatment.

In the example in FIG. 5, a nitride layer 10 is deposited on the substrate 7 and the grid 8 after the silicidation treatment, in order to protect the isolation trenches filled with oxide as explained above in the description.

One particular step of the process then consists of depositing an additional polysilicon layer 11 that covers the nitride layer 10 to form a double dielectric-conductor layer. The double layer is then composed of the nitride layer 10 and the polysilicon layer 11, respectively.

Figure 6:
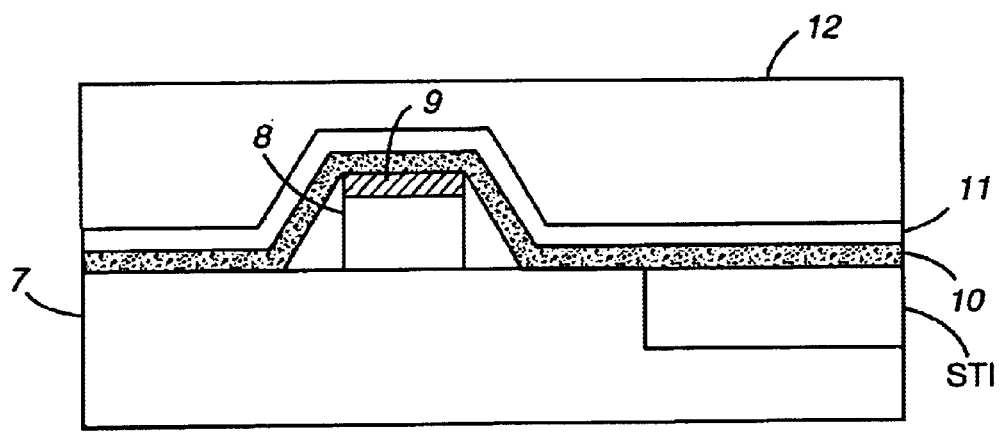

FIG. 6 shows the next step that consists of depositing an oxide layer 12 that covers the dielectric-conductor layers 10 and 11.

Therefore, the oxide layer 12 is made using a planar type process that is characterized by the planeness of the surface obtained after deposit.

Figure 7:
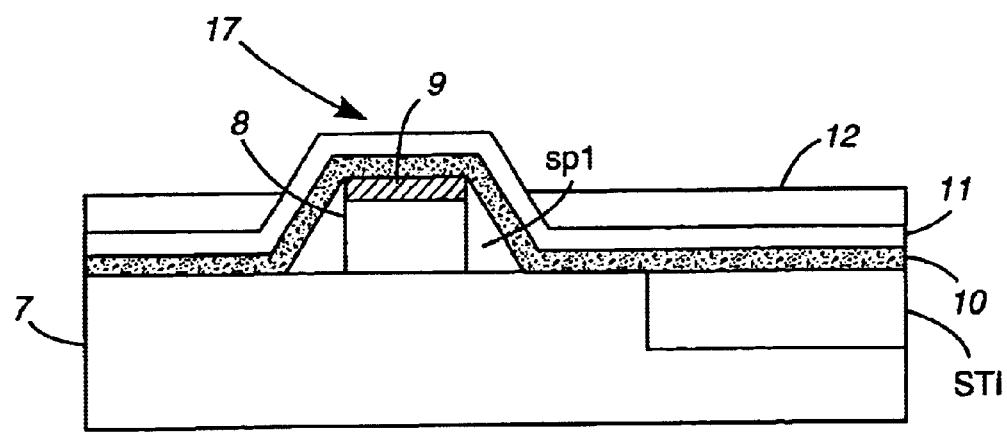

The oxide layer 12 is then removed in order to uniformly lower the level of the oxide layer 12 below the level of the grid 8 of the transistor in order to expose the top part 17 of the double layer that is located above the grid 8, see FIG. 7.

The removal may be done by chemical attack, for example plasma, or by mechanical-chemical polishing of the oxide layer 12. The removal level is controlled by the etching time or the polishing time. If the removal is done by etching, the end of the removal operation is detected when the polysilicon layer 11 is exposed due to selectivity of the chemistries of the oxide and the polysilicon.

Figure 8:
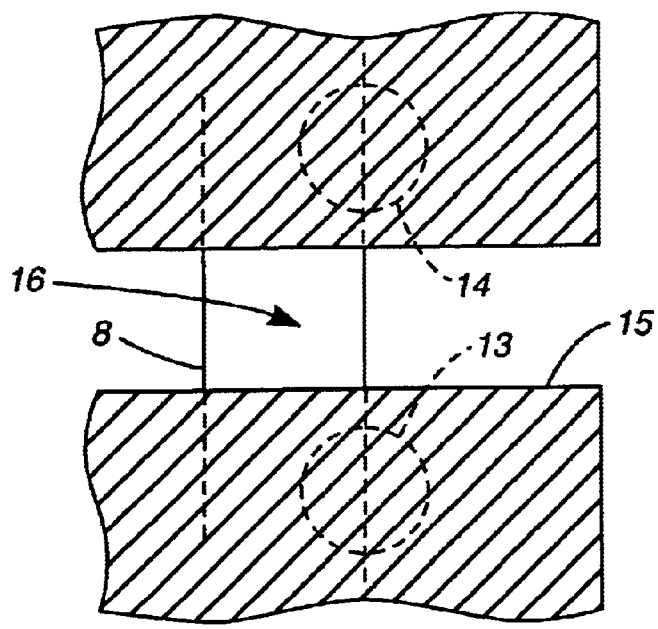

An intermediate step is then used as explained with reference to FIG. 8. FIG. 8 shows a top view of an elementary cell with grid 8 that forms the word line through which the transistors formed in sequence along this line are accessed.

Two cylindrical recesses 13 and 14 are shown for the production of the tungsten interconnection pads straddling over the grid 8.

These two interconnection pads are used to create a contact between the two consecutive transistors on which they are located, and a higher level contact.

A double layer was deposited above grid 8 during the previous steps, the top layer of which is a polysilicon conducting layer 11.

Consequently, the polysilicon layer located above the grid 8 in area 16 between two consecutive transistors must be removed to prevent any electrical contact between the two interconnection pads 13 and 14.

Thus, to prevent short circuits, the polysilicon layer 11 is etched using a mask 15 in the area 16 located above the grid between two consecutive transistors.

Figure 9:
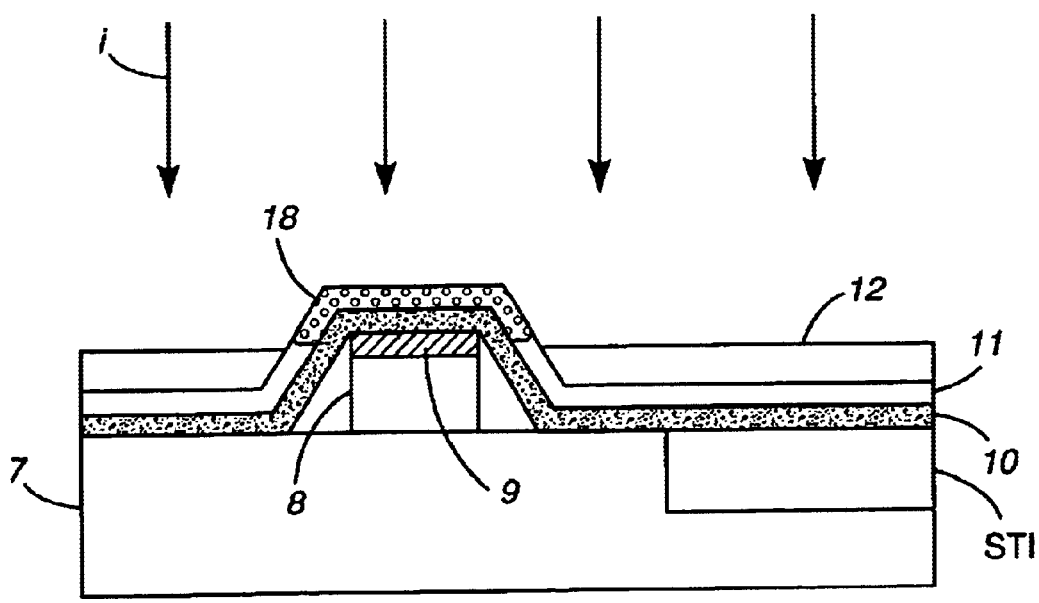

When this precaution has been taken, the next step shown in FIG. 9 consists of making an implant i of doping agents in the polysilicon layer 11. Low energy doping agents were also implanted so as to only implant the polysilicon exposed by the oxide layer 12. For example, BF2 type doping agents are used for the implantation of polysilicon.

Therefore only the emerging part 18 of the polysilicon layer located above the grid 8 will be implanted, since it is the only part of the polysilicon layer exposed by the removal of the oxide layer 12 in the previous step. The other part of the polysilicon layer 11 located under the oxide layer 12 is not implanted.

The purpose of this implantation is to define the selectivity of etching between the doped polysilicon layer 18 and the undoped polysilicon in the polysilicon layer 11 that is protected by the oxide layer 12.

According to a particular embodiment, the previous two steps with reference to FIGS. 8 and 9, namely the etching step to remove the polysilicon layer located above the grid in area 16 between two consecutive transistors to avoid short circuits and the step in which doping agents are implanted in the polysilicon layer 11, may be replaced by a step consisting of implanting doping agents in the polysilicon layer by means of a complementary mask in addition to mask 15. Thus, the part of the polysilicon layer located above the grid in area 16 between two consecutive transistors is not implanted, while only the emerging part 18 of the polysilicon layer located above the grid 8 of a transistor is implanted.

This part of the undoped polysilicon layer located in the area 16 between two consecutive transistors will be selectively removed with respect to the doped polysilicon during a subsequent step described later. Thus, any risk of a short circuit between two consecutive transistors located on the same word line is avoided.

Thus, once the emerging part 18 of the polysilicon layer 11 has been implanted using either of the two methods mentioned above, the oxide layer 12 is no longer necessary. The remaining oxide layer 12 is then completely removed.

This removal is achieved conventionally by means of a wet type etching. The polysilicon layer 11 located below the oxide layer 12 then acts as a stop layer for the etching.

Figure 10:
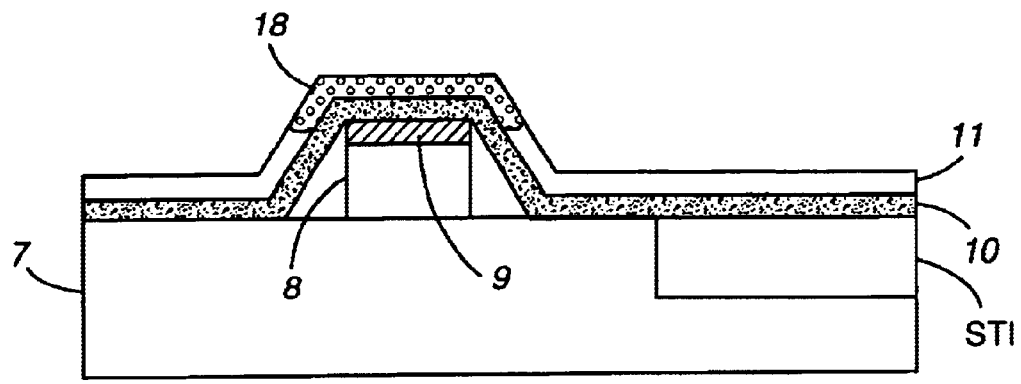

The structure shown in FIG. 10 is obtained after removal of the oxide layer.

Figure 11:
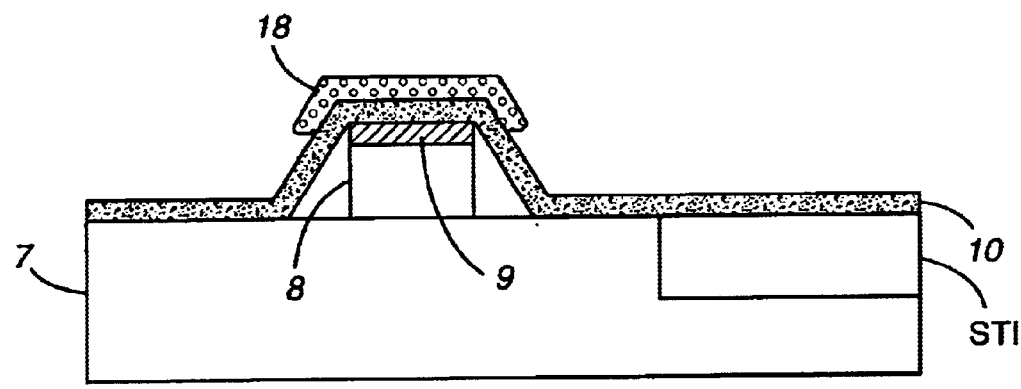

FIG. 11 shows the next step in the process according to the invention. This step consists of using a selective wet type etching to remove only the undoped part of the polysilicon layer 11. Therefore, it enables the selective removal of the undoped polysilicon layer 11 with respect to the emerging part 18 of the polysilicon layer located above the grid and that was implanted earlier.

Wet type KOH or $NH_4OH$ type solutions may be used for selective removal of undoped polysilicon areas.

Thus, only the doped polysilicon layer 18 located above the grid 8 of the transistor remains after selective etching of the undoped polysilicon.

In this way, a double layer consisting of a dielectric-conducting pair has been selectively created exactly at the recess above the grid 8 due to the difference in topography. The dielectric-conducting pair located on the transistor grid is composed of a nitride layer 10 and the doped polysilicon layer 18 respectively.

Once the double dielectric-conducting layer has been obtained on the grid, the steps specific to the formation of the recess of the interconnection pad are applied.

Figure 12:
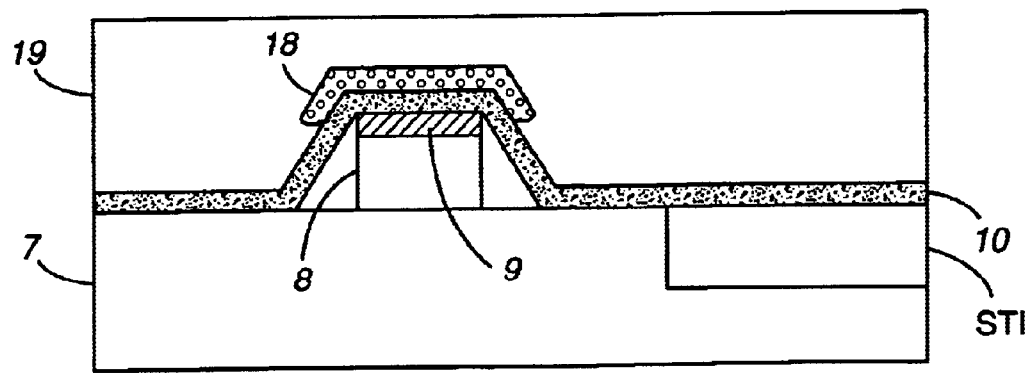

First, a new oxide layer 19 is deposited, see FIG. 12.

Figure 13:
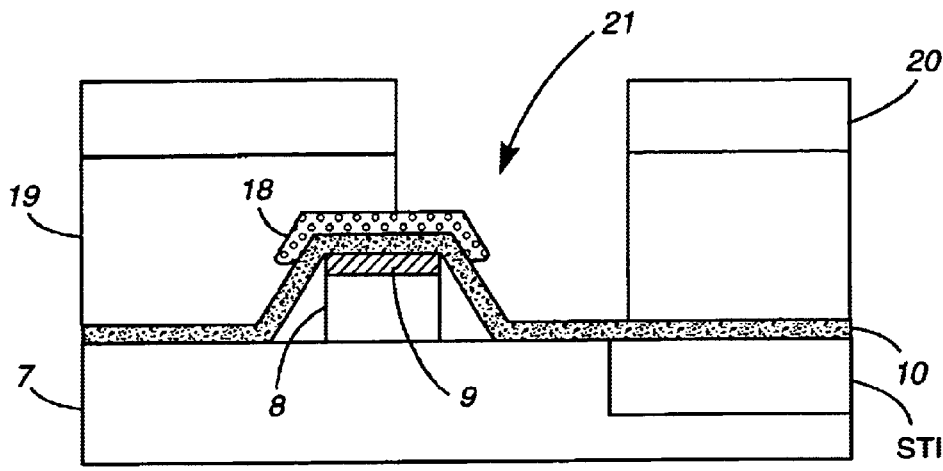

FIG. 13 shows the next photo-engraving operation to define a cylindrical recess 21 straddling over the grid 8 and the silicon substrate 7 in which the interconnection pad will be formed. Therefore, this operation uses a mask 20 with an opening straddling over the grid 8 and the substrate 7.

This photo-engraving step of the recess 21 of the interconnection pad is performed in two sub-steps.

In the first sub-step, the oxide layer 19 is etched until the nitride layer 10 located on the substrate 7 is reached.

This etching step of the oxide layer 19 uses selective chemistry that selectively removes the oxide layer 19 located in recess 21 straddling over the grid and the substrate without touching the doped polysilicon layer 18 located above the grid.

Figure 14:
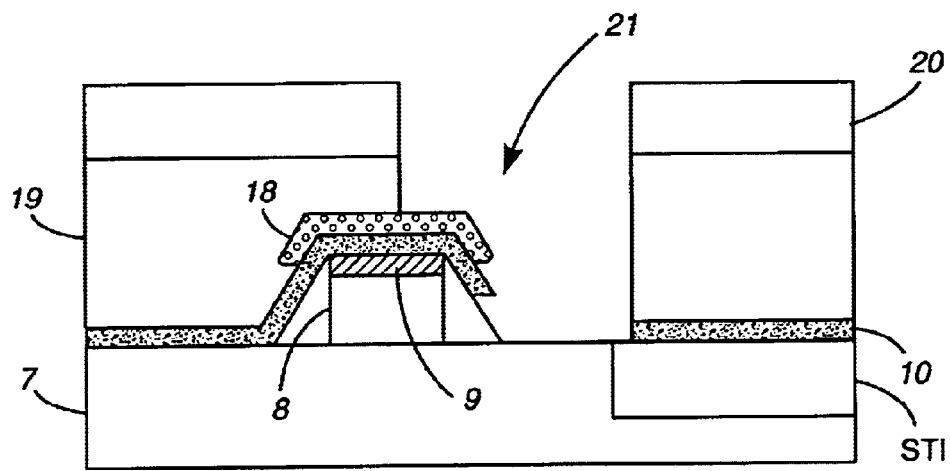

In the second sub-step, in FIG. 14, the nitride layer 10 located at the bottom of recess 21 will be etched in order to release an access to the active area not shown of the silicon substrate 7 to make the contact. The nitride layer 10 is also etched selectively with respect to the doped polysilicon 18 and the oxide 19.

All that remains to be done is to remove the mask 20 and to fill the recess 21 thus created in the oxide layer 19 and the nitride layer 10 with tungsten, to form the local interconnection pad that will form the contact with the upper level.

Therefore there are two advantages to the dielectric-conducting pair on grid according to the invention.

First, the doped polysilicon 18 prevents etching of the nitride layer 10 located on the silicidation layer 9 (or directly on the grid polysilicon 8 if no silicidation treatment was applied) during photo-engraving of the part of the interconnection pad straddling over grid 8 and the silicon substrate 7.

The nitride layer 10 located above the transistor grid then enables the essential separation between the silicidation layer made of cobalt silicon $CoSi_2$ (or the grid polysilicon if there was no silicidation treatment) and the tungsten forming the interconnection pad.

One particular embodiment of the invention proposes another alternative to the use of the mask 15, the function of which is to remove the polysilicon above the grid between two consecutive interconnection pads to prevent short circuits.

In this particular embodiment in which the step applying the mask 15 is deleted, this step consisting of depositing a polysilicon layer 11 at the beginning of the process is replaced by a step consisting of depositing a layer of silicon germanium SiGe, the other steps already mentioned remaining identical.

However, a series of additional steps is performed before filling in the tungsten recess 21 to form the interconnection pad after making the recess 21.

Figure 15:
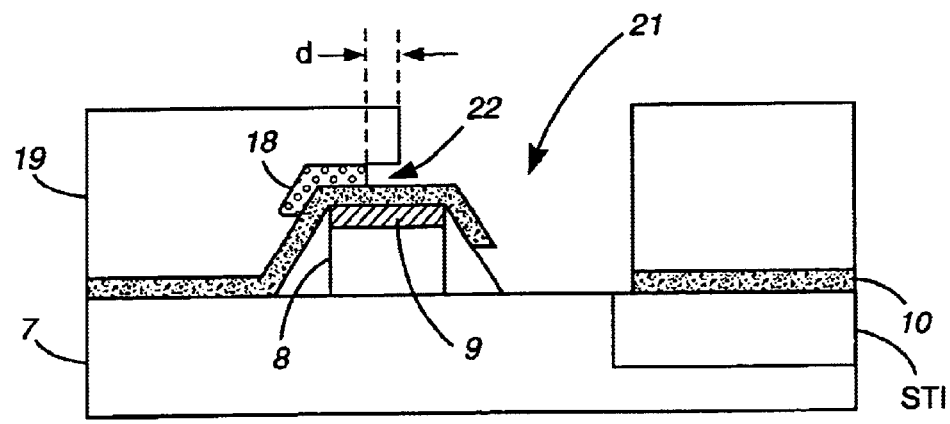

As shown in FIG. 15, a step is then performed in which silicon germanium is selectively removed using a wet etching or isotropic plasma attack type, to form a side cavity 22 between the oxide layer 10 above the grid and the oxide layer 19. Therefore, this step consists of selectively etching the doped silicon germanium layer 18 above the grid 8 with respect to the silicon substrate 7, over a determined depth d.

Figure 16:
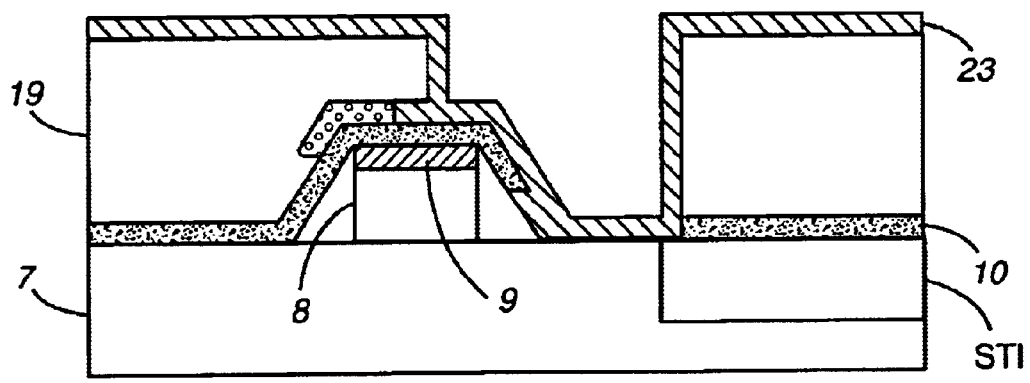

The depth d is determined by the selective etching time of the silicon germanium. The next step with reference to FIG. 16 consists of depositing a nitride layer 23 that will fill the side cavity 22 formed in the previous step.

Figure 17:
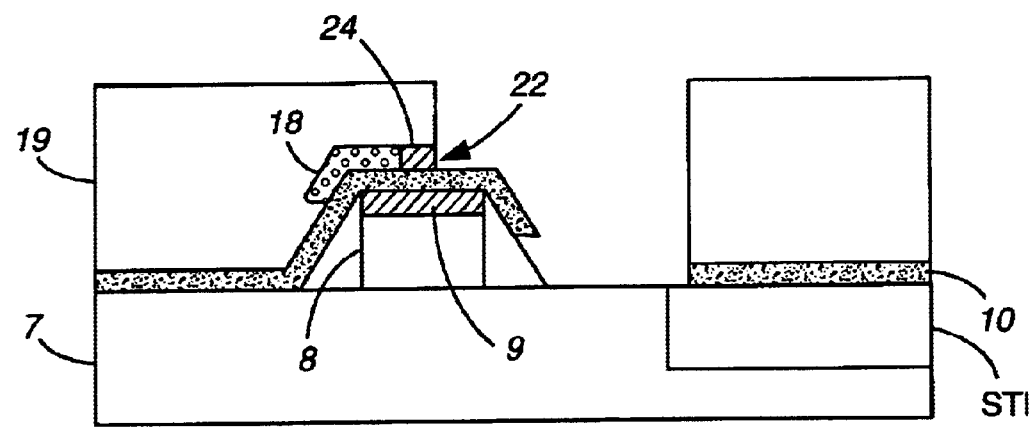

Finally (see FIG. 17), the previously deposited nitride layer will be removed.

All that remains in the side cavity 22 is a nitride plug 24 that isolates the doped polysilicon germanium layer 18 from the tungsten forming the interconnection pad when contact is made on the active area of the silicon substrate 7.

The nitride isolating plug 24 thus prevents short circuits between the two consecutive interconnection pads.

Although a specific embodiment of the invention has been disclosed, it will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

What is claimed is:

1. A method for the protection of a grid of a transistor in an integrated circuit to make a local interconnection pad straddling over the grid and the silicon substrate on which the grid is formed, method comprising:

depositing a nitride layer and then a polysilicon layer on a silicon substrate and on a grid to form a double the dielectric-conducting layer;

depositing a first oxide layer to cover the double dielectric-conducting layer;

removing the first oxide layer under a height of the grid to expose a top part of the double layer above the grid;

implanting one or more low energy doping agents in the polysilicon layer to implant only the polysilicon layer exposed by the first oxide layer to form a doped polysilicon layer;

after the implanting one or more low energy doping agents, using a mask for an etching so as to remove the polysilicon layer in an area located above the grid between two consecutive transistors in order to avoid short circuits;

removing the first oxide layer which is remaining;

selectively etching to remove only the part of the polysilicon layer which has not been doped;

depositing a second oxide layer; and making a photo-engraving of the second oxide layer in order to define a recess that straddles over the grid and the silicon substrate in which the interconnection pad is formed, whereby a portion of the nitride layer is protected during the photo-engraving by the doped polysilicon layer.

2. The method according to claim 1, wherein the step of depositing a nitride layer further comprises depositing a nitride layer on a grid which has previously been covered by a silicidation layer made of cobalt silicon $CoSi_2$ in order to reduce an input resistance of the grid.

3. The method according to claim 2, wherein the step of making a photo-engraving includes:

selectively etching the second oxide layer located in the recess without touching the doped silicon layer above the grid; and selectively etching the nitride layer at the bottom of the recess without touching the doped polysilicon layer in order to obtain access to the active area of the silicon substrate.

4. The method according to claim 2, wherein the step of using a mask and implanting one or more low energy doping agents includes implanting low energy doping agents in the polysilicon layer by using a mask in order to implant only a portion of the polysilicon layer located above the grid so as to form a doped polysilicon layer.

5. The method according to claim 1, wherein the step of making a photo-engraving includes:

selectively etching the second oxide layer located in the recess without touching the doped silicon layer above the grid; and selectively etching the nitride layer at a bottom of the recess without touching the doped polysilicon layer in order to obtain access to an active area of the silicon substrate.

6. The method according to claim 5, wherein the step of using a mask and implanting one or more low energy doping agents includes implanting low energy doping agents in the polysilicon layer by using a mask in order to implant only a portion of the polysilicon layer located above the grid so as to form a doped polysilicon layer.

7. The method according to claim 1, wherein the step of using a mask and implanting one or more low energy doping agents includes implanting low energy doping agents in the polysilicon layer by using a mask in order to implant only a portion of the polysilicon layer located above the grid so as to form a doped polysilicon layer.

8. A method for the protection of a grid of a transistor in an integrated circuit to make a local interconnection pad straddling over the grid and the silicon substrate on which the grid is formed, the method comprising:

depositing a nitride layer and then a polysilicon layer on a silicon substrate and on a grid which has previously been covered by a silicidation layer made of cobalt silicon $CoSi_2$ in order to reduce an input resistance of the grid so as to form a double the dielectric-conducting layer;

depositing a first oxide layer to cover the double dielectric-conducting layer;

removing the first oxide layer under a height of the grid to expose the top part of the double layer above the grid;

using a mask for an etching so as to remove the polysilicon layer in an area located above the grid between two consecutive transistors in order to avoid short circuits;

implanting one or more low energy doping agents in the polysilicon layer to implant only the polysilicon layer exposed by the first oxide layer to form a polysilicon germanium layer which has been doped;

removing the first oxide layer which is remaining by chemical attack or by mechanical-chemical polishing;

after implanting one or more low energy doping agents, selectively etching to remove only the part of the polysilicon layer which has not been doped;

depositing a second oxide layer; and making a photo-engraving of the second oxide layer in order to define a recess that straddles over the grid and the silicon substrate in which the interconnection pad is formed, whereby a portion of the nitride layer is protected during the photo-engraving by the doped polysilicon layer; and selectively etching the doped polysilicon layer located above the grid with respect to the silicon substrate over a determined depth (d) to form side cavity between the nitride layer located above the grid and the second oxide layer.

* * * * *

UNITED STATES PATENT AND TRADEMARK OFFICE
CERTIFICATE OF CORRECTION

PATENT NO.    : 6,689,655 B2
DATED         : February 10, 2004
INVENTOR(S)   : Philippe Coronel et al.

It is certified that error appears in the above-identified patent and that said Letters Patent is hereby corrected as shown below:

Column 7,
Line 38, change "double the" to -- double --

Column 8,
Line 48, change "double the" to -- double --

Column 9,
Line 1, change "layer; and" to -- layer; --

Column 10,
Line 3, change "to form side" to -- to form a side --

Signed and Sealed this

Fifteenth Day of June, 2004

JON W. DUDAS
*Acting Director of the United States Patent and Trademark Office*